United States Patent
Vijay et al.

(10) Patent No.: US 11,416,663 B2
(45) Date of Patent: Aug. 16, 2022

(54) OPTIMIZED ALLOCATION OF FUNCTIONS IN HYBRID MOTOR CONTROLLER IMPLEMENTATIONS

(71) Applicant: Hamilton Sundstrand Corporation, Charlotte, NC (US)

(72) Inventors: Ashish Vijay, Rajasthan (IN); Sesh Mohan Rao, Karnataka (IN); Rajeeva Gopala Krishna, Karnataka (IN); Shardul Shrinivas Bapat, Karnataka (IN); Rajagopal Srinivasan, Karnataka (IN); Manish Kumar, Karnataka (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 313 days.

(21) Appl. No.: 16/710,010

(22) Filed: Dec. 11, 2019

(65) Prior Publication Data
US 2020/0193078 A1    Jun. 18, 2020

(30) Foreign Application Priority Data
Dec. 13, 2018   (IN) .............................. 201811047217

(51) Int. Cl.
*G06F 30/331* (2020.01)
*G06F 11/27* (2006.01)
(Continued)

(52) U.S. Cl.
CPC ............ *G06F 30/331* (2020.01); *G06F 11/27* (2013.01); *G06F 13/4022* (2013.01); *G06F 2213/0038* (2013.01)

(58) Field of Classification Search
CPC .............................. G05B 19/18; G05B 19/408
See application file for complete search history.

(56) References Cited

U.S. PATENT DOCUMENTS

2002/0045952 A1   4/2002   Blemel
2006/0100723 A1   5/2006   Sun et al.
(Continued)

FOREIGN PATENT DOCUMENTS

| | | |
|---|---|---|
| EP | 3062435 A1 | 8/2016 |
| EP | 3340051 A1 | 6/2018 |
| WO | 2012141677 A1 | 10/2012 |

OTHER PUBLICATIONS

Extended European Search Report for application No. 19216278.2-1203, dated Mar. 19, 2020; 9 pages.
(Continued)

*Primary Examiner* — Getente A Yimer
(74) *Attorney, Agent, or Firm* — Cantor Colburn LLP

(57) ABSTRACT

A system for controlling a motor with a plurality of motor control functions including at least a current control loop and a velocity control loop. The system includes one of a hybrid Digital Signal Processor (DSP)-Field Programmable Gate Array (FPGA) architecture having an integral DSP and an integral FPGA or a System on a Chip (SoC) architecture having a Microcontroller Sub-System (MSS) and an FPGA fabric. The current control loop function is assigned to the integral FPGA for the hybrid DSP-FPGA architecture, and at least the velocity control loop function is assigned to the DSP the hybrid DSP-FPGA architecture. Alternatively, the current control loop function is assigned the FPGA fabric of the SoC architecture, and at least the velocity control loop function is assigned to the MSS of the SoC architecture.

20 Claims, 5 Drawing Sheets

(51) Int. Cl.
*G06F 13/40* (2006.01)
*G06F 9/50* (2006.01)

(56) References Cited

U.S. PATENT DOCUMENTS

2016/0018511 A1   1/2016   Nayyar et al.
2016/0313725 A1   10/2016  Yan et al.

OTHER PUBLICATIONS

EPO Official Letter for Application No. 19216278.2, dated Feb. 1, 2022, 8 pages.

OPTIMIZED ALLOCATION OF FUNCTIONS IN HYBRID MOTOR CONTROLLER IMPLEMENTATIONS

CROSS-REFERENCE TO RELATED APPLICATIONS

This application claims the benefit of Indian Patent Application No. 201811047217 filed Dec. 13, 2018, which is incorporated herein by reference in its entirety.

BACKGROUND

The subject matter disclosed herein generally relates to motors and motor control and, more particularly, to allocations of functions in Motor Drive Electronics (MDE) and controllers, especially for aerospace applications.

Aircraft systems commonly include a variety of motor controlled systems. For example, actuation systems for control surfaces, aircraft environmental control systems, and the like. Control devices in motor drive applications are generally implemented with either Digital Signal Processors (DSPs) or Field Programmable Gate Arrays (FPGA). There are multiple factors, which influences the selection of control devices for motor drive applications. One of the major contributing factors driving the selection is the control loop implementation.

To meet demand for higher performance motor drive systems, such as reducing weight of power core, reducing size of power electronics, higher power densities, and the like), it is often required to implement faster current loop control solutions. Faster current control loops are increasingly demanding in terms of CPU throughput in DSP's and the solution may require FPGA's. At the same time, high performance motor drive systems usually need to employ complex algorithms which require complex calculations, powerful math engines, support for floating point computations, support for reliable communication schemes etc., which are best supported by DSPs and DSP blocks in FPGAs. In addition, to support application of FPGAs, many of the FPGA suppliers also provide their proprietary IP Core Blocks (commonly proprietary code tools, routines, toolboxes, and the like employed to implement various functions, which can meet the demand for performance and support complex math operations as well. However, use of proprietary IP Cores is not always feasible due to the cost of verification and data requirements to meet the expectations of certification authorities in aerospace applications. In addition, to this, the cost differences between the DSP and FPGA also influence the final selection of which processing choice is most cost effective.

One more optimal solution to cater specifically to high performance motor drive applications would be making use of the best capabilities of both DSPs and FPGAs that would support multiple architecture schemes. Such a hybrid approach can be achieved by using DSP and FPGA for appropriate functions or a System on Chip (SoC) solution with the combined capabilities of DSP and FPGA. This approach has been used in many industries and there are some aerospace products, making use of hybrid (DSP and FPGA) architecture. In most of these products, the allocation of functions between the DSP and FPGA is done at system level i.e., communications, monitoring, Built-in-test (BIT) etc. maybe allocated to DSP and FPGA may implement the cascaded control loop. This methodology of allocation may not be the most optimal in terms of utilizing the features of DSP and FPGA.

Accordingly, for at least the reasons discussed above, as well as others, there is a desire to provide improved motor control that employs new allocation of the functions used in Motor Drive Electronics (MDE) between DSP and FPGA, which is more optimal and improves the control loop performance.

BRIEF DESCRIPTION

According to one embodiment described herein is a system for controlling a motor with a plurality of motor control functions including at least a current control loop and a velocity control loop. The system includes one of a hybrid Digital Signal Processor (DSP)-Field Programmable Gate Array (FPGA) architecture having an integral DSP and an integral FPGA or a System on a Chip (SoC) architecture having a Microcontroller Sub-System (MSS) and an FPGA fabric. The current control loop function is assigned to the integral FPGA for the hybrid DSP-FPGA architecture, and at least the velocity control loop function is assigned to the DSP of the hybrid DSP-FPGA architecture. Alternatively, the current control loop function is assigned the FPGA fabric of the SoC architecture, and at least the velocity control loop function is assigned to the MSS of the SoC architecture.

In addition to one or more of the features described above, or as an alternative, further embodiments may include identifying another of the motor control functions of the plurality of motor control functions as motor position sensing and allocating the position sensing to the FPGA the hybrid DSP-FPGA architecture or the FPGA fabric of the SoC architecture.

In addition to one or more of the features described above, or as an alternative, further embodiments may include identifying another of the motor control functions of the plurality of motor control functions as motor position control loop and allocating the motor position control loop to the DSP of the hybrid DSP-FPGA architecture or the MSS of the SoC architecture.

In addition to one or more of the features described above, or as an alternative, further embodiments may include identifying another of the motor control functions of the plurality of motor control functions as Continuous Built in Test (CBIT) and allocating a portion of the CBIT to the DSP of the hybrid DSP-FPGA architecture or the MSS of the SoC architecture.

In addition to one or more of the features described above, or as an alternative, further embodiments may include identifying another of the motor control functions of the plurality of motor control functions as Continuous Built in Test function (CBIT) and allocating a portion of the CBIT function to the FPGA of the hybrid DSP-FPGA architecture or the FPGA fabric of the SoC architecture.

In addition to one or more of the features described above, or as an alternative, further embodiments may include that the portion of the CBIT to the FPGA of the hybrid DSP-FPGA architecture or the FPGA fabric of the SoC architecture is based on a processing rate of the CBIT function.

In addition to one or more of the features described above, or as an alternative, further embodiments may include identifying another of the motor control functions of the plurality of motor control functions as current sensor processing and allocating the current sensor processing to the FPGA of the hybrid DSP-FPGA architecture or the FPGA fabric of the SoC architecture.

In addition to one or more of the features described above, or as an alternative, further embodiments may include identifying another of the motor control functions of the plurality of motor control functions as PWM processing and allocating the PWM processing to the DSP of the hybrid DSP-FPGA architecture or the MSS of the SoC architecture.

In addition to one or more of the features described above, or as an alternative, further embodiments may include identifying another of the motor control functions of the plurality of motor control functions as DC Bus processing and allocating the DC bus processing to the FPGA of the hybrid DSP-FPGA architecture or the FPGA fabric of the SoC architecture.

In addition to one or more of the features described above, or as an alternative, further embodiments may include identifying another of the motor control functions of the plurality of motor control functions all communications processing and allocating the communications processing to the DSP of the hybrid DSP-FPGA architecture or the MSS of the SoC architecture.

In addition to one or more of the features described above, or as an alternative, further embodiments may include identifying another of the motor control functions of the plurality of motor control functions as the system state machine and allocating the system state machine functionality processing to the DSP of the hybrid DSP-FPGA architecture or the MSS of the SoC architecture.

Also described herein in another embodiment is a system for controlling a motor with a plurality of motor control functions including at least a current control loop and a velocity control loop. The system including one of a hybrid Digital Signal Processor (DSP)-Field Programmable Gate Array (FPGA) architecture having an integral DSP and an integral FPGA, or a System on a Chip (SoC) architecture having a Microcontroller Sub-System (MSS) and an FPGA fabric. At least the current control loop function is assigned to the integral FPGA for the hybrid DSP-FPGA architecture, and at least the velocity control loop function is assigned to the DSP the hybrid DSP-FPGA architecture, or at least the current control loop function is assigned the FPGA fabric of the SoC architecture, and at least the velocity control loop function is assigned to the MSS of the SoC architecture.

In addition to one or more of the features described above, or as an alternative, further embodiments may include a motor position sensing as another motor control function of the plurality of motor control functions and allocating the motor position sensing to the FPGA the hybrid DSP-FPGA architecture or the FPGA fabric of the SoC architecture.

In addition to one or more of the features described above, or as an alternative, further embodiments may include a motor position control loop function as another motor control functions of the plurality of motor control functions and allocating the motor position control loop function to the DSP of the hybrid DSP-FPGA architecture or the MSS of the SoC architecture.

In addition to one or more of the features described above, or as an alternative, further embodiments may include a Continuous Built in Test (CBIT) function as another motor control functions of the plurality of motor control functions and allocating a at least a portion of the CBIT to the DSP of the hybrid DSP-FPGA architecture or the MSS of the SoC architecture.

In addition to one or more of the features described above, or as an alternative, further embodiments may include allocating at least portion of the CBIT function to the FPGA of the hybrid DSP-FPGA architecture or the FPGA fabric of the SoC architecture, wherein the portion of the CBIT to the FPGA of the hybrid DSP-FPGA architecture or the FPGA fabric of the SoC architecture is based on a processing rate of the CBIT function.

In addition to one or more of the features described above, or as an alternative, further embodiments may include a current sensor processing function as another motor control functions of the plurality of motor control functions and allocating the current sensor processing to the FPGA of the hybrid DSP-FPGA architecture or the FPGA fabric of the SoC architecture.

In addition to one or more of the features described above, or as an alternative, further embodiments may include a PWM processing function as another motor control functions of the plurality of motor control functions and allocating the PWM processing to the DSP of the hybrid DSP-FPGA architecture or the MSS of the SoC architecture.

In addition to one or more of the features described above, or as an alternative, further embodiments may include a system state machine function as another motor control functions of the plurality of motor control functions and allocating the system state machine function processing to the DSP of the hybrid DSP-FPGA architecture or the MSS of the SoC architecture.

Also described herein in another exemplary embodiment is a motor drive system. The motor drive system includes a power source, a drive operably connected to the power source, the drive including a controller, a motor operably connected to the drive, the motor having a plurality of motor control functions including at least a current control loop and a velocity control loop. The controller includes one of a hybrid Digital Signal Processor (DSP)-Field Programmable Gate Array (FPGA) architecture having an integral DSP and an integral FPGA and a System on a Chip (SoC) architecture having a Microcontroller Sub-System (MSS) and an FPGA fabric. At least the current control loop function is assigned to the integral FPGA for the hybrid DSP-FPGA architecture, and at least the velocity control loop function is assigned to the DSP the hybrid DSP-FPGA architecture, or wherein at least the current control loop function is assigned the FPGA fabric of the SoC architecture, and at least the velocity control loop function is assigned to the MSS fabric of the SoC architecture.

The foregoing features and elements may be combined in various combinations without exclusivity, unless expressly indicated otherwise. It should be understood, however, that the following description and drawings are intended to be illustrative and explanatory in nature and non-limiting.

BRIEF DESCRIPTION OF THE DRAWINGS

The foregoing and other features, and advantages of the present disclosure are apparent from the following detailed description taken in conjunction with the accompanying drawings in which.

DETAILED DESCRIPTION

Figure 1:
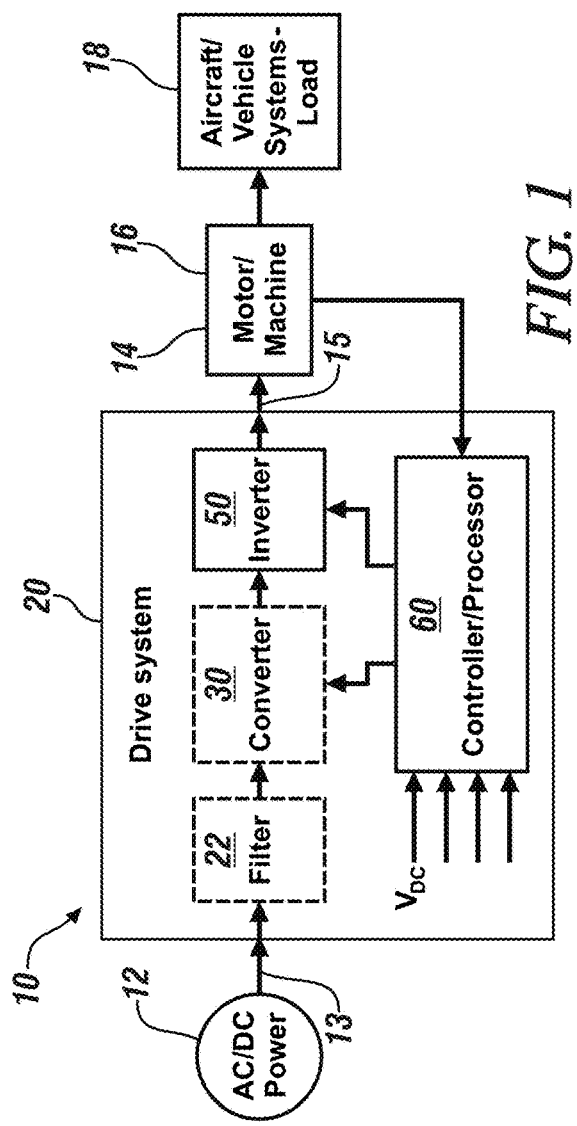
FIG. 1 depicts a high level block diagram of motor drive system in accordance with one or more embodiments.

Embodiments described herein are directed to a new allocation of the functions used in Motor Drive Electronics (MDE) between DSP and FPGA, which is more optimal and improves the control loop performance. The described embodiments provide the functional allocation for a System on a Chip (SoC), which consists of a microprocessor core, microcontroller sub-system and an FPGA fabric (i.e., the FPGA interconnect matrix and all the building blocks of FPGA). The described embodiments provide for improvement in control loop performance by implementing a hybrid architecture between a DSP and FPGA with optimal allocation of functions to supports high performance motor controllers. This approach supports tunability and re-use, thus helping to reduce development efforts and reduces the Non-Recurring Engineering (NRE) Costs. The major benefit is to have a hardware platform, which will be relatively unchanged across a broad spectrum of applications and reduce the manufacturing costs by increasing the volume of production. Advantageously, the tunability and modularity of the hybrid platform will also allow the same hardware to be used across numerous applications further reducing the time to market. The circuit blocks used on the hardware platform go through the design and verification cycle along with qualification and certification artifacts being produced as per aerospace practices (e.g., compliance with DO-254). As a result, the cost for qualification and certification is also reduced. This would also promote re-use of circuit blocks to put together designs very quickly. The optimized allocation is done for SoC's as well so that in future when SoC devices are certified for use in safety critical applications, the architecture can easily transition to SoC based designs.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended. The following description is merely illustrative in nature and is not intended to limit the present disclosure, its application, or uses. It should be understood that throughout the drawings, corresponding reference numerals indicate like or corresponding parts and features. As used herein, the term controller refers to processing circuitry that may include an application specific integrated circuit (ASIC), an electronic circuit, an electronic processor (shared, dedicated, or group) and memory that executes one or more software or firmware programs, a combinational logic circuit, and/or other suitable interfaces and components that provide the described functionality.

Additionally, the term "exemplary" is used herein to mean "serving as an example, instance or illustration". Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection", and by stating the term connection, it shall be understood that both an indirect and a direct connection are being recited.

FIG. 1 is a block diagram of components of a power system 10 as may be employed to power one or more systems or loads 18. The power system 10 is described with respect to an aircraft power system, however application to any system where a three phase or motor drive is employed may be envisioned. Power system 10 includes a source of AC/DC power 12, such as an electrical main line, (e.g., 115/230 volt AC 400 Hz, 3-phase), power bus, DC power bus, battery and the like. The AC/DC power 12 is provided to a drive system 20. The drive 20 may include a filter 22 configured to limit inrush currents, stabilizes voltage levels and suppress electromagnetic interference (EMI). The input power signals 13, once filtered (if employed), are provided to a rectifier or converter 30. The converter 30 is configured to convert the AC power 12 to a DC voltage. The converter 30 may also convert a DC voltage input to a different level DC voltage as may be required in the drive 20. In an embodiment, the converter 30 is active and may be a single or multi-level configuration. The converter 30 could also be a simple passive rectifier, e.g., a diode bridge configured to rectify an AC voltage input to a DC voltage. The output of the converter 30 supplies a DC bus 34. A filter (not shown) may be employed stabilizing the DC bus 34 from transients and to suppress EMI as is conventionally known.

The illustrated drive 20 also includes an inverter 50 to convert the DC voltage on the DC bus 34 to multiphase, AC drive motor command signals 15. Motor command signals 15 from the inverter 50 of the drive system 20 are supplied to a multiphase machine 14. For example, a motor 16 to impart motion to a control surface, power an environmental control system, and the like. In an exemplary embodiment, machine 14 includes, but is not limited to a multiphase, permanent magnet synchronous motor 16. It should also be appreciated, that while the embodiments herein are described primarily with reference to an aircraft electrical system and application, this description is for example only. The embodiments described here are readily applied to any application employing a three phase drive with a multiphase phase motor power application including motor controls, environmental control, control surface actuation, and any other power system and motor control application.

According to one or more embodiments, both rectifier/converter 30 (if an active type) and inverter 50, are controlled by a controller 60. In an alternative embodiment, converter 30 and inverter 50 may be controlled by separate controllers, 60. As stated above controller(s) 60 provides control signals 62 to the switching devices of the inverter 50 to control generation of the of the motor command signals 15. Likewise, the controller 60 may provide control signals 62 to the active rectifier or converter 30 to control generation and maintenance of the DC voltage on the DC bus 34. Drive controller 60 may be implemented using a hybrid controller microprocessor (DSP) executing a computer program stored on a storage medium to perform the operations described herein and/or implemented in hardware (e.g., ASIC, FPGA). It should also be understood that the drive controller 60 may be a combination of hardware/software.

In operation, in embodiments employing an active converter 30, the controller 60 develops a DC voltage command for the converter 30 based on the operation of the motor 16 and the inverter 50 generating the motor command signals 15. The DC voltage command is then employed to formulate the PWM control commands 62 for the switching devices (not shown) of the converter 30 to control the DC bus 34 accordingly. In addition, the controller 60 receives various input signals or values, including set point signals or values for desired output operation, such as DC bus voltage, motor speed, position, torque, etc., as well as feedback signals or values representing operational values of various portions of the motor drive 20. In another embodiment, a passive rectifier configuration for the converter 30 is employed and no PWM commands 62 from the controller 60 are needed. While such a configuration is advantageous because of its simplicity for employing passive rectifiers to supply the DC bus 34, other configurations with an active converter 30 may be desirable for improved input current harmonics and electromagnetic interference (EMI) control. Likewise, the controller 60 develops a command for the inverter 50 based on the operation the motor 16 e.g., speed, torque, and the like and the inverter 50 generating the motor command signals 15. The command is then employed to formulate the PWM control commands 64 for the switching devices of the inverter 50 to formulate the motor command signals 15 accordingly.

Conventionally a pulse width modulation (PWM) control scheme is employed to command the switching devices of the converter 30 to supply the DC bus and the inverter 50 to generate and control the motor command signals 15 to the motor 16. Conventionally, such a PWM control scheme employs space vector pulse width modulation SVPWM techniques. Moreover, conventionally the SVPWM for the converter 30 (if active) and inverter 50 would be operated at the same frequency and synchronized. Synchronization of the PWM for both the converter 30 and the inverter 50 improves functions and reduces generated EMI from the operation of the switching devices of the converter 30 and inverter 50). However, in some applications, other PWM techniques may be employed to address the advantages and constraints imposed by the construction or particular implementation of the converter 30 or inverter 50. For example, conventional discontinuous (DPWM) or even hybrid SVPWM techniques. Hybrid SVPWM is effectively a combination or hybrid of SVPWM and DPWM techniques. Moreover, while it is well known that increasing switching frequency facilitates reductions in the size of magnetics, filters, improves acoustics, and the like, though it does result in increased switching losses in the switching devices for the converter 30 or for the switching devices of the inverter 50. Therefore, in some embodiments, particularly where an active converter 30 is employed it may be advantageous to operate the converter 30 at a different PWM frequency than those of the inverter 50 or with a different PWM scheme than the inverter 50. However, increased operating frequencies also results in increased switching losses in the switching devices reducing efficiency and potentially causing the switching devices to overheat. As a result, while SVPWM is effective for most applications though it is less efficient, employing conventional discontinuous (DPWM) or hybrid SVPWM improves efficiency. Finally, for the inverter 50, in applications where torque/current control are important, low current distortion (and thereby low torque ripple) is commonly desired. As such, continuous SVPWM or hybrid SVPWM techniques are conventionally employed to ensure good motor response. In the embodiments, as described herein conventional SVPWM techniques are employed.

Continuing with FIG. 1, the inverter 50 receives the phase voltage modulation demands e.g., control signals 64 from the PWM generation unit 160 and converts the direct current (DC) power into alternating current (AC) power. In this example, the inverter 50 represents a three-phase inverter that converts DC power from the DC bus 34 into three-phase AC power, which is provided to the motor 16. The inverter 50 includes any suitable structure for converting power from the DC bus 34 to the AC voltage signals to form phase voltage motor command signals 15 to the motor 16. For example, the inverter 50 could include one or more switches devices (not shown) driven using pulse width modulation (PWM) signals.

The motor 16, in one embodiment, is a permanent magnet motor that operates using the voltages provided by the inverter 50. The motor 16 in a rotary configuration, includes a rotor with magnets embedded in or connected to the rotor. The motor 16 also includes a stator with multiple teeth around which conductive windings are wound. The windings are selectively energized and de-energized based on the signals from the inverter 50, which creates a rotating magnetic field that causes the rotor to rotate. The motor 16 drives a machine 14. The motor 16 can drive the machine 14 with, for example, a drive shaft and one or more gears. Likewise, in linear applications the stator is linearly arranged once again selectively energized and de-energized based on signals from the inverter 50, which causes a translation of forces that moves the secondary.

Figure 2:
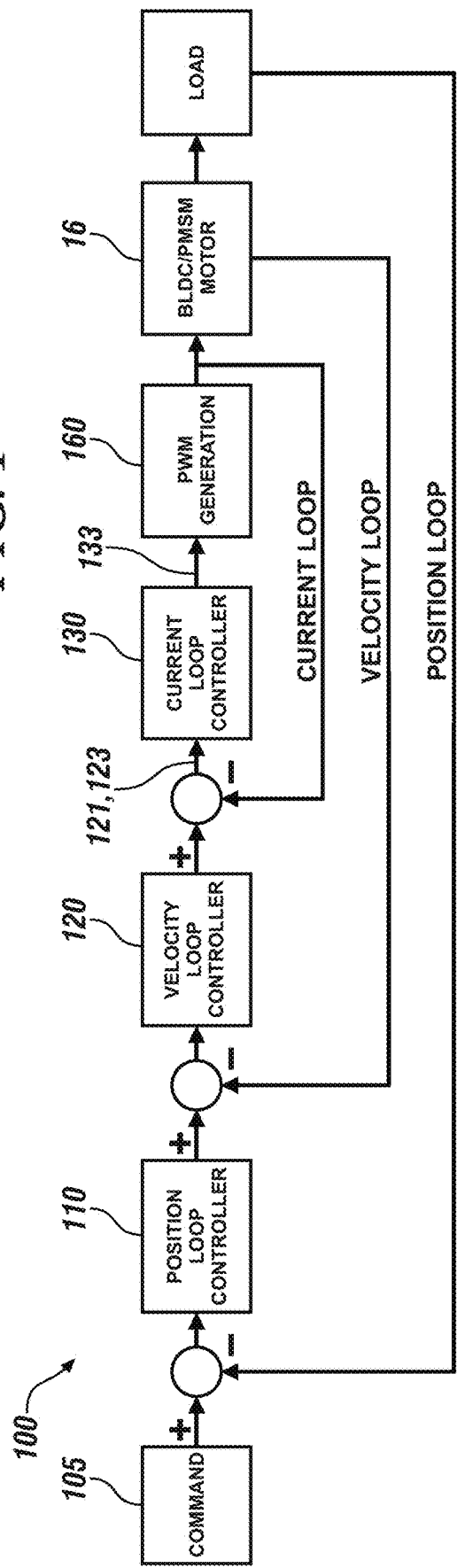
FIG. 2 depicts a high level block diagram of a control system and processes for a motor in accordance with one or more embodiments.

FIG. 2 is an example block diagram of a control process for the power system 10 indicated generally as 100, with a field oriented controlled (FOC) of a permanent magnet synchronous machine (PMSM) or brushless DC (BLDC), e.g., motor 16. In motor control applications for PMSM/BLDC motors there are three interdependent performance characteristics: position, speed, and current. To change position of the motor rotor, its velocity needs to change. In turn, to change its velocity, the current applied to the motor windings through pulse-width modulation (PWM) needs to change. An example of a cascaded control loop used for motor control is shown in FIG. 2.

Continuing with FIG. 2, the process 100 also includes a motor rotor reference frame current regulation scheme according to an embodiment. The process 100 includes a motor control system employed to control the position, speed, torque, or force of a motor 16. In particular, the process 100 includes conventional position control loop with a position control function 110. The position control function 110 includes a desired/requested position and a position feedback from the motor 16. The position control function 110 formulates a velocity demand as its output. In an embodiment, the position control function 110 is a proportional (P) control process, though in other embodiments other control topologies are possible including proportional-integral (PI) proportional-derivative (PD), and proportional-integral-derivative (PID). In addition, the process 100 includes a conventional velocity control loop with a velocity control function 120 connected to the position control function 110. The velocity control function 120 includes demanded velocity as its input an compares it with the velocity feedback from the motor 16. The velocity control function 120 formulates a direct current demand (Id) and quadrature current demand (Iq) as its output. In an embodiment the velocity control function 120 is proportional-integral (PI) control process, though in other embodiments other control topologies are possible including proportional (P), proportional-derivative (PD), and proportional-integral-derivative (PID).

Continuing with FIG. 2, the process 100 also includes a rotor reference frame current regulation scheme that formulates voltage demand values for the motor 16. In particular the process 100 includes control loops for Id, and Iq and current control function 130 for Id and Iq. The current control function 130 is connected to the velocity control function 120 and includes demanded Id and Iq as its inputs and compares it with Id and Iq feedback respectfully, formulated from sensed phase currents e.g., Ia, Ib, and Ic from the motor 16. The current control function 130 formulates a direct voltage demand (Vd) and quadrature voltage demand (Vq) as its output. In an embodiment the current control function 130 is proportional-integral-derivative control process, though in other embodiments other control topologies are possible including proportional, proportional-derivative and proportional-integral. The current control function 130 transmits the two rotor reference frame demand voltages Vd and Vq to a rotor reference frame voltage to phase voltage transformation unit 140. A rotor reference frame voltage to phase voltage transformation unit (not shown) converts the two rotor reference frame voltages Vd and Vq to a phase voltage demands in the form Va, Vb, and Vc. The phase voltage demands Va, Vb, and Vc are supplied to space vector modulation function (Not shown) and then ultimately to the PWM generation function 160. The space vector modulation function controls the particular pulse width modulation technique and mapping employed, while the PWM generation function 160 is connected to the space vector modulation function and receives the percentage pulse width commands to controls the width of the pulse or pulse duration, based on modulator signal information in accordance with the selected PWM scheme.

Figure 3:
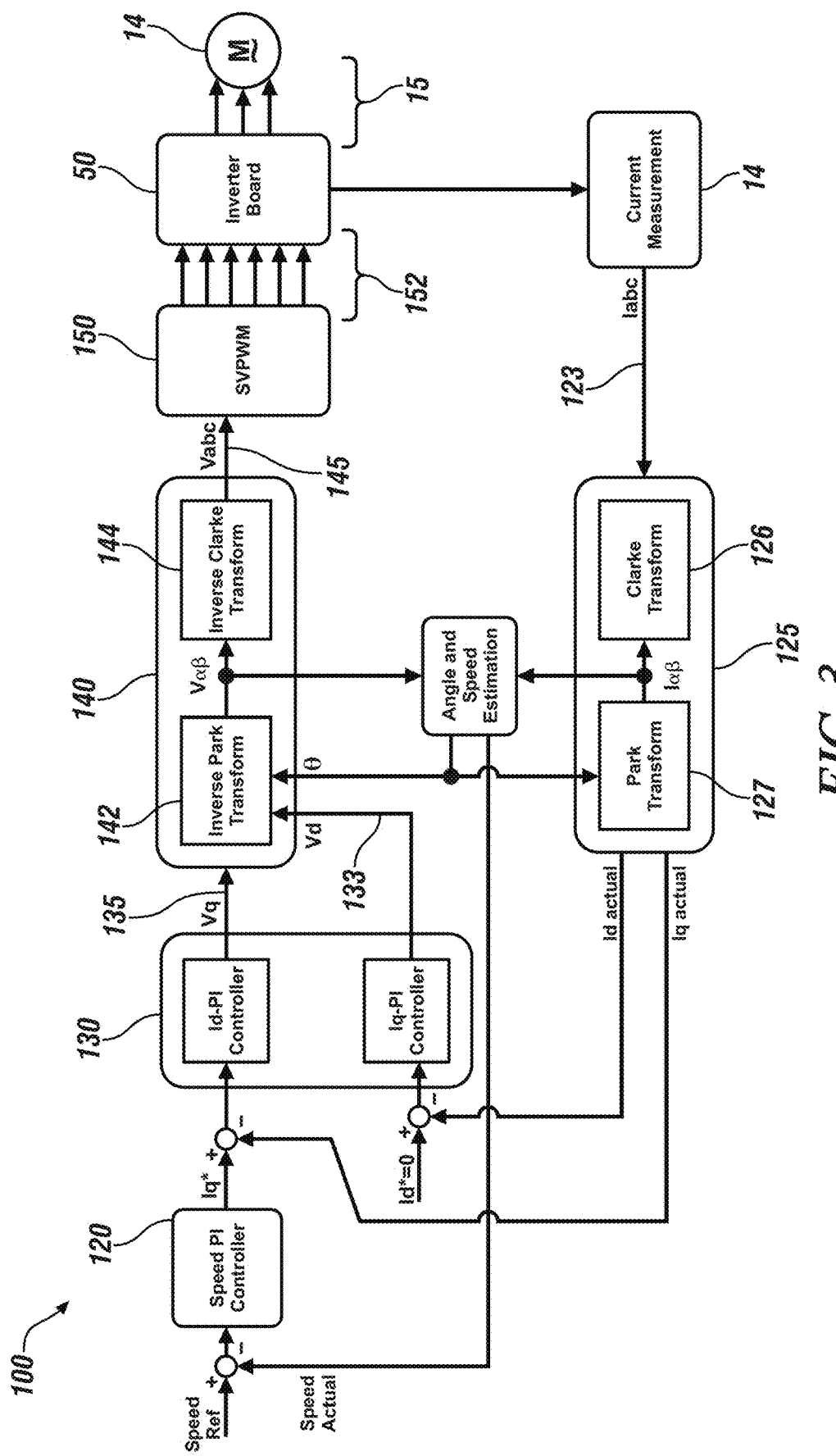
FIG. 3 depicts a more detailed block diagram of a control system and processes for a motor for a motor in accordance with one or more embodiments.

Turning now to FIG. 3 depicting further detail of a portion of the method of FOC as may be employed to control a motor 16. Continuing with FIG. 3, the process 100 also includes a motor rotor reference frame current regulation scheme according to an embodiment. The process 100 includes a motor control system employed to control the position, speed, torque, or force of a motor 16. In particular, the process may include a 100 conventional position control loop with a position control function 110 (FIG. 2). As shown in FIG. 2, the position control function 110 includes a desired/requested position and a position feedback from the motor 16. The position control function 110 formulates a velocity demand as its output. Continuing with FIG. 3, in addition, the process 100 includes a conventional velocity control loop with a velocity control function 120 connected to the position control function (not shown in this depiction). The velocity control function 120 includes demanded velocity (denoted as Speed Ref.) as its input compares it with the velocity feedback from the motor 16. The velocity control function 120 formulates a direct current demand (Id) and quadrature current demand (Iq). In some embodiments the direct current demand (Id) is fixed to zero as part of the implementation of the FOC. In an embodiment the velocity control function 120 is proportional-integral (PI) control process, though in other embodiments other control topologies are possible including proportional (P), proportional-derivative (PD), and proportional-integral-derivative (PID).

Continuing with FIG. 3, the process 100 also includes a rotor reference frame current regulation scheme that formulates voltage demand values for the motor 16. In particular the process 100 includes control loops for Id, and Iq and current control function 130 for Id and Iq. The current control function 130 is connected to the velocity control function 120 and includes demanded Id and Iq as its inputs and compares it with Id and Iq feedback as depicted respectfully, formulated from sensed phase currents e.g., Ia, Ib, and Ic from the motor 16. In an embodiment, a transform function is employed to convert sensed phase currents, e.g., Ia, Ib, and Ic denoted 123 from the motor 16 to the rotor reference frame. In an embodiment this transform function 125 is a conventional Park's transform 127 and Clarke's transform 126, however other transforms may be employed. The current control function 130 formulates a direct voltage demand (Vd) and quadrature voltage demand (Vq) as its output. In an embodiment, the current control function 130 is proportional-integral-derivative control process, though in other embodiments other control topologies are possible including proportional, proportional-derivative and proportional-integral. The current control function 130 transmits the two rotor reference frame demand voltages Vd and Vq to a rotor reference frame voltage to phase voltage transformation unit 140. The rotor reference frame voltage to phase voltage transformation unit 140 is operably connected to the current control function 130 and converts the two rotor reference frame voltages Vd and Vq to a phase voltage demands in the form Va, Vb, and Vc. In an embodiment this transform is a conventional inverse Park's transform 142 and inverse Clarke's transform 144, however other transforms may be employed. The phase voltage demands Va, Vb, and Vc are supplied to space vector modulation function 150 and then ultimately to the PWM generation function 160. The space vector modulation function 150 is operably connected to the transform function 140 and controls the particular pulse width modulation technique and mapping employed, while the PWM generation function 160 (FIG. 2) is connected to the space vector modulation function 150 and receives the percentage pulse width commands 152 to controls the width of the pulse or pulse duration, based on modulator signal information in accordance with the selected PWM scheme.

The position control function 110, velocity control function 120 and current control function 130, the rotor reference frame voltage to phase voltage transformation unit 140, and the PWM generation unit 160 together control the operation of the inverter 50 to thereby control the operation of the motor 16. For example, the PWM generation unit 160 generates PWM signals that drive the transistor switches in the inverter 50. By controlling the duty cycles of the PWM signals, the PWM generation unit 160 controls the three-phase voltages provided by the inverter 50 to the motor 16. For example, in one embodiment, the velocity control function may receive as input a commanded speed signal, which identifies a desired speed of the motor 16. The velocity control function 120 receives as feedback measured or estimated motor speed, optionally rotor position, or other characteristic(s) of the motor 16. The PWM generator 160 uses the inputs to generate PWM signals for driving the transistor switches in the inverter 50.

Although FIGS. 2 and 3 illustrate one example of a system 100 with a field oriented controlled (FOC) permanent magnet synchronous machine (PMSM), various changes can be made to without departing from the scope of this disclosure. For example, various components in FIG. 1 can be combined or further subdivided. As a particular example, one or more of the components 110, 120, 130, 140, 150, and 160 could be distributed differently, combined, or even incorporated into the motor 16 itself.

In motor control applications as described herein for PMSM/BLDC motors the control is described with respect to three interdependent performance characteristics: position, speed, and current. To change position of the motor rotor, its velocity needs to change. In turn, to change its velocity, the current applied to the motor windings through pulse-width modulation (PWM) needs to change. This approach inherently aids stability by correcting underlying errors before they can propagate. The innermost current loop maintained by the current loop controller 130 can independently modify torque to respond to a change in load well before the load change significantly impacts the more outer loops on velocity and position. At the same time, it will be appreciated that this nested loop approach means that outer loops on position and velocity can only perform as well as their underlying inner loops. Efforts to enhance position and speed performance will inevitably fall short if the inner loop lacks the bandwidth to support outer loop performance expectations. Ultimately, the performance of the inner current loop effectively defines the limits of performance of the overall control system.

Moreover, using a fast simultaneous sampling analog-to-digital converter (ADC) to measure motor current, perform the processes to implement the control methodologies for FOC to achieve the desired motor performance adds significant computational burden. FOC algorithms manipulate vector representations of currents, using Park and Clarke transforms to arrive at an optimal solution. In addition, rotor angle computation using Resolver or Hall Effect Sensing also feeds into the control loop as will be described further herein. On the other hand, to improve inner loop bandwidth, PWM carrier frequency has been increased to 30 kHz and above commensurate with the inverter switching frequency. At these higher frequencies, conventional current loop designs begin to lag, unable to complete control algorithms rapidly enough. This necessitates use of a dedicated FPGA, to perform calculation of control algorithms at higher carrier frequencies. Therefore, in an embodiment, in order to achieve the best performance, optimal allocation of the tasks and functions in the control loop, between the DSP and FPGA is provided. Advantageously, in such a configuration, the computational power of the DSP and the parallel operation, PWM generation of the FPGA can both be utilized.

In an embodiment, two existing architecture scenarios are considered: First, a hybrid architecture employing a DSP and FPGA. Second, an architecture using SoC, where SoC includes FPGA. As stated herein, while both these architectures currently exist, neither includes a unique allocation of functionality and processes as described herein, configured to specifically capture the advantages and particular strengths of each of the components in the respective architecture. To clarify, and distinguish between the architectures, it should be appreciated that a hybrid architecture has a separate integral DSP and integral FPGA. In the hybrid architecture, the functions are split up between two devices. Conversely, an SoC is a hybrid device with a processor core built on an FPGA fabric with the ability to handle the control loop processing, however there may be an additional FPGA or DSP included that can be used along with SoC to handle additional functions such as monitor device, complex communication etc. In addition, it should also be noted that a hybrid architecture also supports having control processing functions in one device and another device can be a monitor device if required, i.e., going back to a non-optimized allocation. This would not be possible with SoC architecture as control processing and a monitor functions would be required to be separate devices to ensure compliance with regulatory requirements, for example, in flight control applications. Turning now to a descriptions of the functions and features of the two architectures and then the application of the described embodiments in each.

Hybrid Architecture with DSP and FPGA

Figure 4:
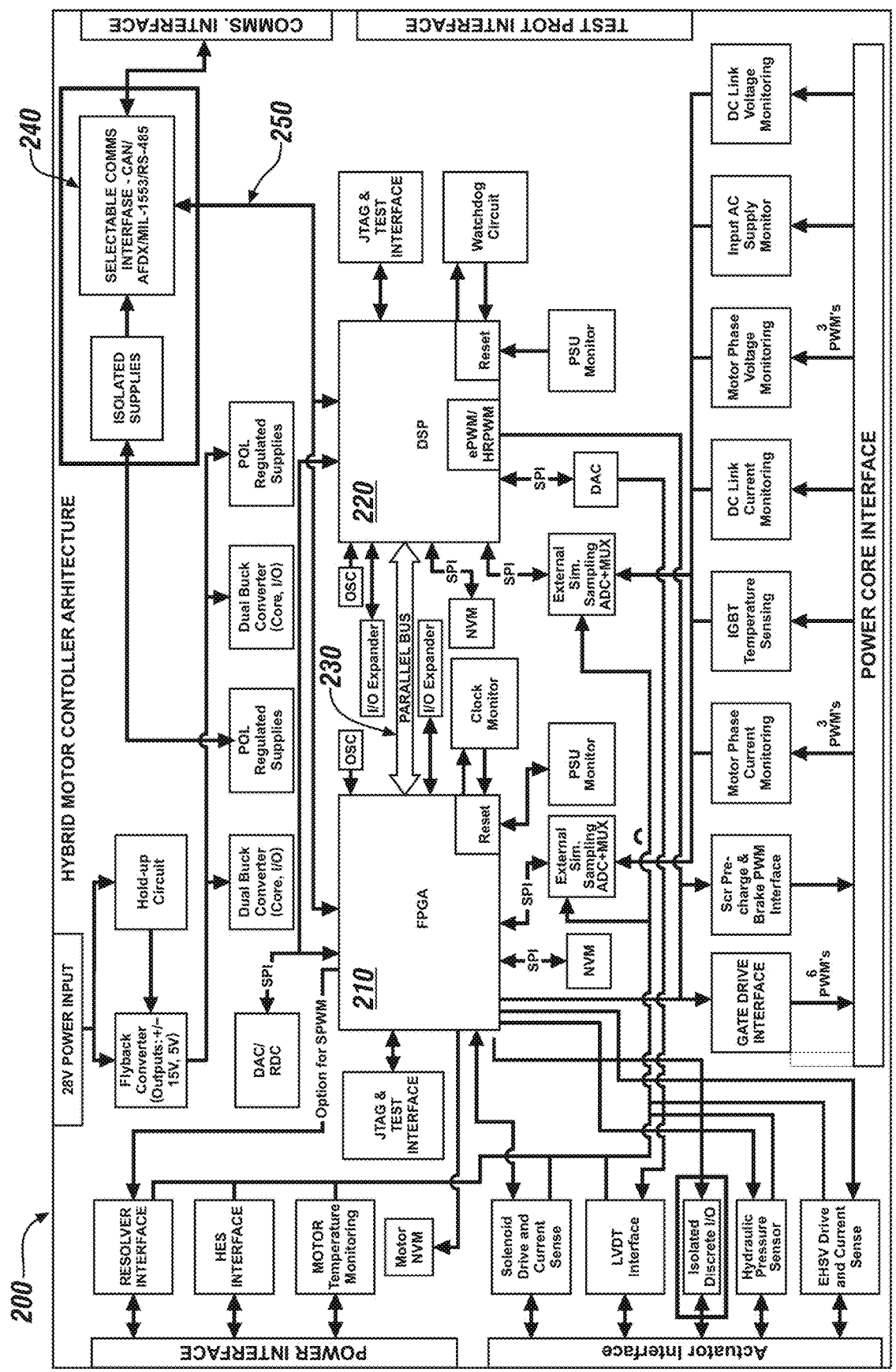
FIG. 4 depicts example detailed block diagram of a hybrid DSP-FPGA for motor control applications in accordance with one or more embodiments.
Figure 5:
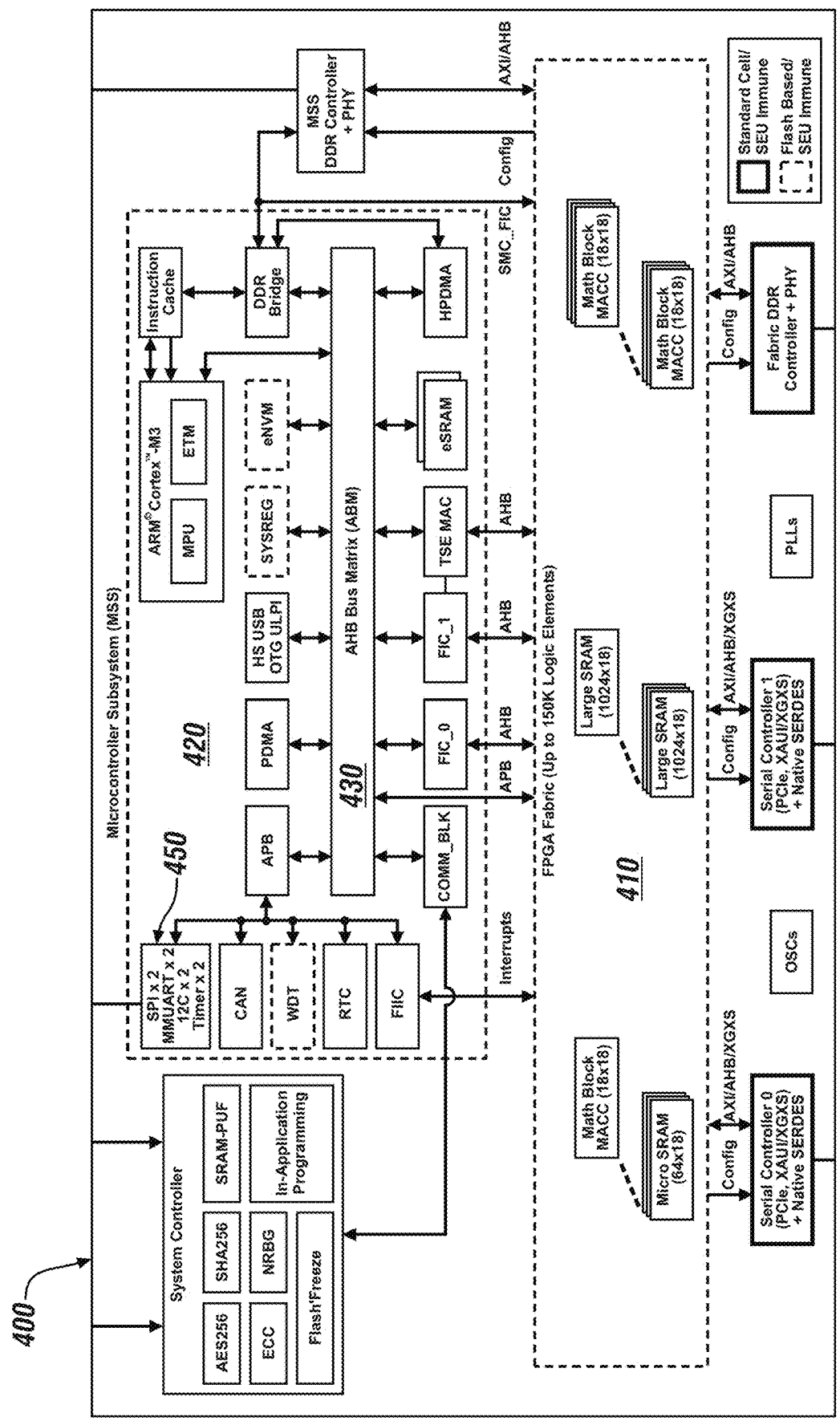
FIG. 5 depicts a detailed block diagram of a System on a Chip implementation with a microcontroller sub-system and a FPGA fabric for motor control applications in accordance with one or more embodiments.

FIG. 4 depicts an example of an existing hybrid architecture 200 with an integrated FPGA 210 and DSP 220 for a motor drive functions from Microsemi® Corp. While it is common to use DSP's 220 or FPGA's 210 for motor controllers 60 the described embodiments provide for numerous unique features apart from and beyond the optimal allocation of functions. In an embodiment, the following features are given particular attention in their applicability to the described allocation and split of functionality for the architecture 200.

High Speed Parallel Bus: One of the advantages of these architectures 200 is to have a fast communication interface for data exchange between the DSP 220 and FPGA 210 in order to support high performance control loop implementations. The hybrid architecture 200 makes use of a DSP 220 and an FPGA 210 with a high speed parallel bus 230 for communication between the DSP and the FPGA. In motor controllers, a parallel bus 230 is used for memory interfaces and complex communication like AFDX and not between control devices/lanes (redundant channels implemented for improved reliability). Usually between lanes or control devices, a serial interface is employed, which is used to communicate monitored parameters and such like for redundancy monitoring. In a control-monitoring implementation for motor control applications, conventionally the control functions are implemented in a single device. For the described embodiments, the control function is partitioned between two devices using a Hybrid/SoC approach with a high speed bus between them. In addition, as a variant, in an alternative embodiment where all control functionality is allocated to and accomplished by a single device (e.g., the FPGA 210), the other device (e.g., the DSP 220) can potentially serve as the monitoring functions. In SoC architecture there is an internal bus available between the MSS and FPGA Fabric which will be put to use when functions allocated to the FPGA fabric and MSS interact with each other.

Flexibility in handling Motor Control: The hybrid architecture 200 provides the ability to handle motor control completely from the FPGA 210, completely from the DSP 220 or with the optimal allocation of functions between the FPGA 210 and DSP 220 as described further herein. If one device (either the FPGA 210 or the DSP 220) is selected to completely handle the motor control, the other device can be used as a monitor device in safety critical applications or for handling additional I/O's. Once again, conventionally, a single control device alone has the ability to control the motor and the hardware has provision only for one device to control the motor. In the described embodiments, with the architecture 200 and the allocation of functions described, the control loop functions are functionally divided and handled by each device.

Flexibility in handling Aircraft Communication: The hybrid architecture 200 provides the ability to support a variety of commonly employed aircraft communication schemes such as CAN, MIL-STD-1553, ARINC 429, AFDX (ARINC 664) through a selectable communication interface 240, which can interface to respective communication cards. Both the FPGA 210 and DSP 220 will interface to the selectable communication interface 240 through a parallel/serial peripheral interface (SPI) (SPI interface) 250 so that the aircraft communication can be handled by either the FPGA 210 or DSP 220. There is provision for the DSP 220 to communicate through in built CAN, as most DSP's 220 support in built CAN peripheral. In a described embodiment, the unique functional allocation includes being able to handle a variety of aircraft communication through a common interface and the fact that either FPGA 210 or DSP 220 can handle this based on system decisions/software/firmware capabilities.

Flexibility in handling Diagnostics Communication: The hybrid architecture provides the ability to support a variety of test port communication schemes such as custom interfaces based on SPI/Parallel Interfaces 250 or CAN/Ethernet based diagnostics. Both the FPGA 210 and DSP 220 are provided the option for a test port interface apart from their respective JTAG programming interfaces.

Rotor Position Sensing: The hybrid architecture 200 will also be able to support both Resolver based rotor position sensing & Hall Effect Sensor based rotor position sensing methods. In addition, sensorless control will also be supported by using the measured motor phase voltage, motor phase current. Advantageously, the hybrid architecture 200 supports resolver based rotor position sensing using resolver excitation and feedback circuits. The hybrid architecture 200 provides: a). a sine modulated PWM (SPWM) provided by the FPGA and demodulation being done by the firmware; b). a DAC which is commanded by the DSP or FPGA over SPI interface and demodulation being done by the software or firmware; and c) RDC chip, which generates the excitation, receives the feedback and calculates the rotor angle and communicates to the DSP 220 or FPGA 210 through SPI 250.

SoC Based Architecture

FIG. 4 depicts the internal architecture 400 of a System on Chip (SoC) implementation for a motor controller from Microsemi® Corp. The SoC architecture 400, is based on FPGA fabric 410 with a hardware ARM processor core 420 with supporting peripherals such as SPI 450, CAN, I2C, Ethernet etc. FPGA Fabric 410 features memory and high-performance DSP signal processing. The Microcontroller Sub-system (MSS) 420 includes a 32-Bit ARM Cortex-M3 processor operating at 1.25 DMIPS/MHz instruction cache with embedded SRAM and embedded nonvolatile memory. The MSS 420 also includes Ethernet interfaces, CAN controller, conforms to ISO11898-1, 32 transmit and 32 receive buffers and Two SPI ports.

Apart from the novelties of the hybrid architecture 200, there are few specific novelties of the SoC architecture 400. In an embodiment, the following features are given particular attention in their applicability to the described allocation and split of functionality for the architecture 400.

High Speed Interface between FPGA Fabric 410 and MSS 420: The SoC 400 has a high speed internal communication collectively denoted as 430 between the Microcontroller Sub-system (MSS) 420 and FPGA Fabric 410, which are controlled by the APB Matrix, Fabric Interface Controller (FIC) and AHB Configuration Bus. Taking advantage of this feature of the SoC 400 would help establish an easy distribution of functions between FPGA fabric 410 and MSS 420, reduce latency and establish optimal control loop operation.

Scaling across applications: In the original hybrid architecture, the FPGA can be replaced by the SoC and the DSP 420 would not be required, thus simplifying the architecture. Alternatively, the DSP 420 can be used for handling the sensor interfaces from the upper level systems to cater to Primary Flight Control Systems, Secondary Flight Control Systems, Trimmable Horizontal Stabilizer Actuator (THSA) etc.

Geared for the Future: The future of aerospace will be based on SoC's 400 and in the near term they will become certifiable. The need for SoC's 400 arises in aerospace primarily due to changes in the architecture from a federated architecture to Integrated Modular Avionics Architecture which results in increase in the amount of data being processed. A SoC architecture 400 would have the advantage of a parallel processing engine along with a sequential processing engine to provide the best performance. The hybrid architecture 200 has the advantage that it can be future ready to support SoC 400 based designs without making any change in hardware as the FPGA 410 family chosen can be selected to be compatible with existing hybrid architectures e.g. 200 and thereby ensure the pin allocation is done such that the devices can be interchanged on the same PCB footprint.

Optimal Allocation of Functions in Hybrid Architecture and SoC Based Architecture The described embodiments provide the functional allocation of high performance motor control functions for a hybrid DSP and FPGA architecture 200 as well as for a System on a Chip (SoC) architectures 400, having of a microprocessor core in a microcontroller sub-system 420 and an FPGA fabric 410. The described embodiments provide for improvement in control loop performance with by implementing a more optimal allocation of functions within the architecture between a processor functions and FPGA functions to support high performance motor controller requirements. That is, DSP 220 and FPGA for the hybrid architecture 200 and MSS 420 and FPGA fabric 410 for the SoC architecture 400. More specifically, the tasks associated with the control loops and other functions of the motor control functions as described herein are allocated to various components in each the two architectures 200, 400.

The major benefit of the described embodiments is to formulate a hardware platform, which will be relatively unchanged across a broad spectrum of applications and reduce the manufacturing costs by increasing the volume of production. Advantageously, the tunability and modularity of the hybrid platform 200 will also allow the same hardware to be used across numerous applications further reducing the time to market. The circuit blocks used on the hardware platform go through the design and verification cycle along with qualification and certification as per aerospace practices. As a result, the cost for qualification and certification is also reduced. More specifically, as the hardware architecture is fixed in hardware, commercial aerospace qualification (e.g., DO-160) and certification (e.g., DO-254) for the hardware would not be of the typical significant effort for every new product introduction (NPI) saving Non Recurring Cost (NRC). Also the circuit blocks that are created and implemented can readily be re-used for other similar projects. Any changes required per a given project may be made in software or firmware. This would also promote re-use of circuit blocks to put together designs very quickly. The optimized allocation is done for SoC's 400 as well so that when SoC devices 400 are certified for use in safety critical applications, the architecture can easily transition to SoC based designs as well.

Table 1 depicts various motor controller functions and the functional allocation for both the Hybrid architecture 200 or a SoC device architecture 400. In the table, selected particular motor controller functions are specifically allocated to particular portions (e.g., the DSP 220 vs FPGA 210) of the Hybrid DSP-FPGA 200. Likewise, a similar allocation is provided as between the FPGA Fabric 410 and the MSS 420 (Microcontroller sub system of the SoC 400). Also provided in the table is an explanation of the features and benefits and/or reasoning for the selected allocation.

TABLE 1

Allocation of motor control functions for Hybrid DSP-FPGA and SoC.

| Function | Sub-function | Preferred Allocation | Specific Features and Characteristics |
|---|---|---|---|
| Resolver/ HES processing | Pre-Processing of data Position calculation Velocity calculation Post-processing of data | Hybrid - FPGA SoC- FPGA Fabric | Single architecture with ability to handle current control loop in either DSP or FPGA: In applications which require faster current loop rates FPGA can support the fast operation to support angle calculation at current loop rates (~30 kHz), applications which require nominal current loop rates <20 kHz can use the DSP for current control loop |
| Current Sensor processing | | Hybrid - FPGA SoC- FPGA Fabric | |
| Current loop | | Hybrid - FPGA SoC- FPGA Fabric | |
| Continuous BIT (CBIT) | Low sample rate based monitoring and less critical monitoring | Hybrid - DSP SoC- MSS | Distributed BIT Strategy: Low rate BIT will be easy to implement in DSP due to floating point calculation, as well as support by Model Based Design approach. High rate BIT which can be critical and requires fast rate operation is allocated to the FPGA |
| | Fast sample rate based monitoring and critical monitoring | Hybrid - FPGA SoC- FPGA Fabric | |
| I/O processing (Discrete Inputs and Outputs) | | Either DSP or FPGA | NA |
| PWM generation | | Hybrid - DSP SoC- MSS | Distributing Current Loop and PWM Generation: Better resolution and control of PWM can be achieved in DSP on account of the higher internal clock supported by the PWM modules in DSP's. The internal clock of the DSP is derived from the system clock and can be as high as 120 MHz. FPGA's can achieve clock resolution that is supported by maximum system clock which can typically be 30-40 MHz. |
| DC Link | DC Link Fault Detection and DC Link Measurement | DC Link Measurement Hybrid - DSP SoC - MSS DC Link Fault Detection Hybrid - FPGA SoC- FPGA Fabric | Distribution of DC Link Measurement and DC Link Fault Detection: Although the DC Link Measurement can be done with the DSP, in case of a fault the response from FPGA is much faster, thus fault detection and reporting can be done by FPGA, while the monitoring of the DC Link can be done by the DSP. |
| LVDT processing | | Hybrid - DSP SoC- MSS | Distribution of Outer Loop (Velocity, Position Loop, Surface Position) and Inner Loop (Current Loop) between DSP and FPGA: Easy to implement these functions in DSP due to floating point calculation, as well as support by Model Based Design approach. These functions will be run at a lower rate, for e.g. position loop will be run at lower rate (in order of ~500 Hz), velocity loop will be run at lower rate (in order of ~1 KHz). The higher rate current loop will be implemented in the FPGA. |
| Temperature processing | | Hybrid - DSP SoC- MSS | |
| Velocity Loop | | Hybrid - DSP SoC- MSS | |
| Position Loop | | Hybrid - DSP SoC- MSS | |

TABLE 1-continued

Allocation of motor control functions for Hybrid DSP-FPGA and SoC.

| Function | Sub-function | Preferred Allocation | Specific Features and Characteristics |
|---|---|---|---|
| Initiated BIT (IBIT) | | Hybrid - DSP SoC- MSS | |
| Power ON BIT (PBIT) | | Hybrid - DSP SoC- MSS | |
| State machine (Flight phase and (or) mode) | | Hybrid - DSP SoC- MSS | Separation of System State Machine from the Control Loop: Modes/States can be handled by DSP and communicated to FPGA |
| NVM processing | | Hybrid - DSP SoC- MSS | Easy to implement with DSP due to peripheral support |
| Aircraft Comm. | | Hybrid - DSP or FPGA SoC- Protocol Function can be allocated between FPGA Fabric and MSS optimally. | Flexibility in Aircraft Communication Strategy: Aircraft Communication such as CAN will typically be implemented on DSP with supported peripherals, whereas more intensive communication such as ARINC664/AFDX can be implemented using FPGA with IP Cores. Present day DSP's also offer high end timers to support some of the protocols such as ARINC429. In addition if a separate Communications Module is identified (with selectable communications CAN/AFDX/MIL1553 etc.) either the FPGA or DSP can be interfaced to such a module with Parallel Bus or SPI Bus providing great flexibility. Also utilizing SoC would allow protocol implementation to be divided between the FPGA Fabric and MSS making best use of parallel and sequential execution. |
| Test Port Comm. & Diagnostics | | Hybrid - DSP or FPGA SoC- Protocol Function can be allocated between FPGA Fabric and MSS optimally. | Flexibility in Test Port Diagnostics: FPGA and DSP can be interfaced over parallel or Serial bus to support test port diagnostics and also support Ethernet if required. Also utilizing SoC would allow protocol implementation to be divided between the FPGA Fabric and MSS making best use of parallel and sequential execution. |

*Allocation to MSS of SoC means Microcontroller Sub-system

Figure 6:
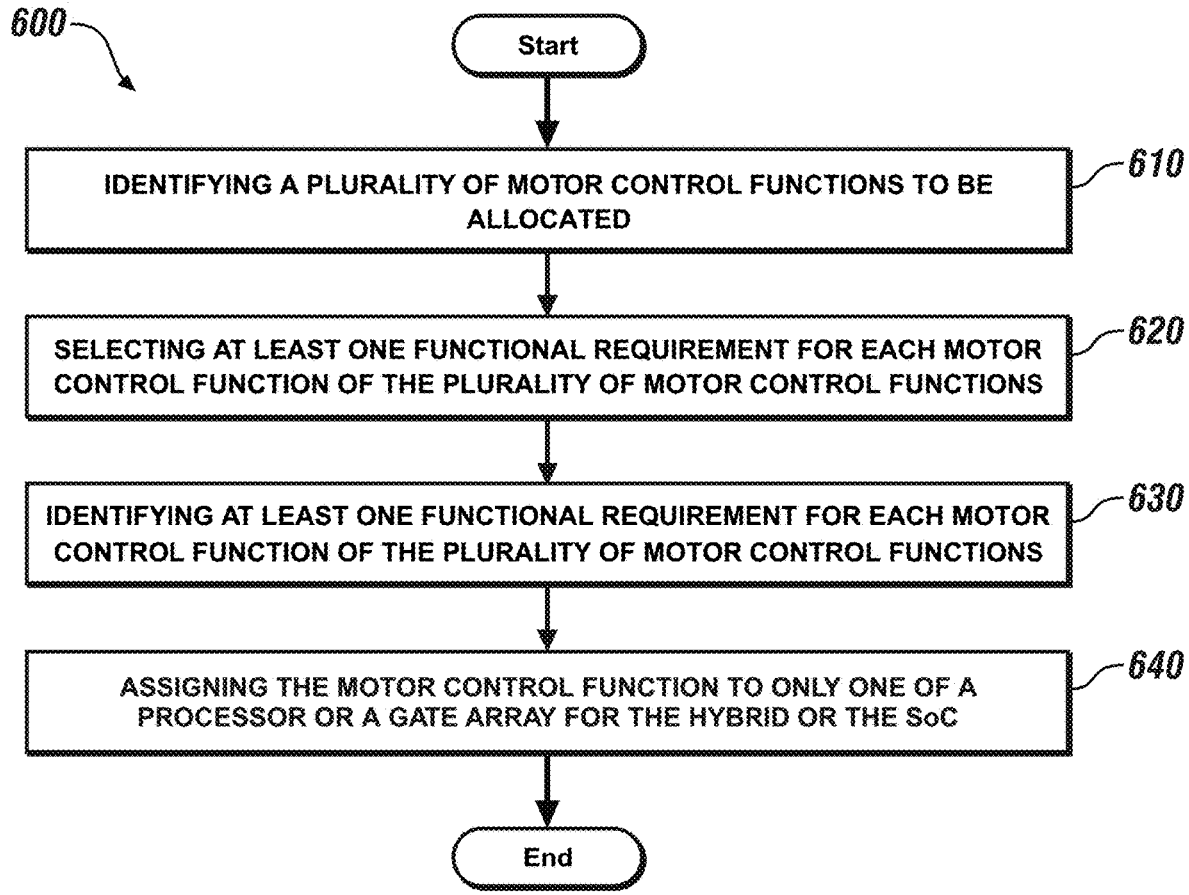
FIG. 6 is a flowchart of a method of allocating functions to a processor or FPGA in accordance with one or more embodiments.

FIG. 6 is a flowchart of a method 600 for allocating motor controller functions is at least one of a hybrid DSP-FPGA 200 or a SoC architecture 400. The method 200 includes identifying a plurality of motor control functions to be allocated as depicted at process step 610. At process step 620 the method 6 continues with selecting at least one functional requirement for each motor control function of the plurality of motor control functions. For a given motor control function, they are then classified based on their primary and/or key performance requirement(s)—e.g., rate of operation, computation complexity, I/O intensive, and the like. Further, the method 600 includes determining how at least one functional requirement would be performed most efficiently by either a processor 220, 420 or gate array 210, 410 of the Hybrid 200 or SoC 400 architectures as depicted at process step 630 and as described above. For example, these performance requirements are compared to the capability of DSP 220/MSS 420 or FPGA 210/410 and the allocation of functions is done based on which device has the capability to meet that need. Finally, as depicted at process step 640, the method 600 includes assigning the motor control function only one of the processor or the gate array for the hybrid 200 or SoC 400.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present embodiments may be a system, a method, and/or a computer program product at any possible technical detail level of integration. The computer program product may include a computer readable storage medium (or media) having computer readable program instructions thereon for causing a processor to carry out aspects of the present disclosure.

The flowchart and block diagrams in the figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

What is claimed is:

1. A method of allocating motor control functions for a hybrid Digital Signal Processor (DSP)-Field Programmable Gate Array (FPGA) architecture having an integral DSP and an integral FPGA or a System on a Chip (SoC) architecture having a Microcontroller Sub-System (MSS) and an FPGA fabric, the method comprising:
    identifying a plurality of motor control functions to be allocated the plurality of motor control functions including at least a current control loop and a velocity control loop;
    selecting at least one functional requirement for each motor control function of the plurality of motor control functions;
    determining how the at least one functional requirement would be performed most efficiently by either the integral DSP or integral FPGA of the hybrid DSP-FPGA architecture or the MSS) and an FPGA fabric of the SoC architecture; and
    assigning the motor control function to only one of the integral DSP or integral FPGA of the hybrid DSP-FPGA architecture or the MSS and an FPGA fabric of the SoC architecture,
    wherein at least the current control loop function is assigned to the integral FPGA for the hybrid DSP-FPGA architecture, and at least the velocity control loop function is assigned to the DSP the hybrid DSP-FPGA architecture; or
    wherein at least the current control loop function is assigned the FPGA fabric of the SoC architecture, and at least the velocity control loop function is assigned to the MSS of the SoC architecture.

2. The method of claim 1, further including identifying another of the motor control functions of the plurality of motor control functions as motor position sensing and allocating the position sensing to the FPGA the hybrid DSP-FPGA architecture or the FPGA fabric of the SoC architecture.

3. The method of claim 1, further including identifying another of the motor control functions of the plurality of motor control functions as motor position control loop and allocating the motor position control loop to the DSP of the hybrid DSP-FPGA architecture or the MSS of the SoC architecture.

4. The method of claim 1, further including identifying another of the motor control functions of the plurality of motor control functions as Continuous Built in Test (CBIT) and allocating a portion of the CBIT to the DSP of the hybrid DSP-FPGA architecture or the MSS of the SoC architecture.

5. The method of claim 4, further including identifying another of the motor control functions of the plurality of motor control functions as Continuous Built in Test function (CBIT) and allocating a portion of the CBIT function to the FPGA of the hybrid DSP-FPGA architecture or the FPGA fabric of the SoC architecture.

6. The method of claim 5, wherein the portion of the CBIT to the FPGA of the hybrid DSP-FPGA architecture or the FPGA fabric of the SoC architecture is based on a processing rate of the CBIT function.

7. The method of claim 1, further including identifying another of the motor control functions of the plurality of motor control functions as current sensor processing and allocating the current sensor processing to the FPGA of the hybrid DSP-FPGA architecture or the FPGA fabric of the SoC architecture.

8. The method of claim 1, further including identifying another of the motor control functions of the plurality of motor control functions as PWM processing and allocating the PWM processing to the DSP of the hybrid DSP-FPGA architecture or the MSS of the SoC architecture.

9. The method of claim 1, further including identifying another of the motor control functions of the plurality of motor control functions as DC Bus processing and allocating the DC bus processing to the FPGA of the hybrid DSP-FPGA architecture or the FPGA fabric of the SoC architecture.

10. The method of claim 1, further including identifying another of the motor control functions of the plurality of motor control functions all communications processing and allocating the communications processing to the DSP of the hybrid DSP-FPGA architecture or the MSS of the SoC architecture.

11. The method of claim 1, further including identifying another of the motor control functions of the plurality of motor control functions as the system state machine and allocating the system state machine functionality processing to the DSP of the hybrid DSP-FPGA architecture or the MSS of the SoC architecture.

12. A system for controlling a motor with a plurality of motor control functions including at least a current control loop and a velocity control loop, the system comprising:
    one of:
        a hybrid Digital Signal Processor (DSP)-Field Programmable Gate Array (FPGA) architecture having an integral DSP and an integral FPGA; or
        a System on a Chip (SoC) architecture having a Microcontroller Sub-System (MSS) and an FPGA fabric;
        wherein at least the current control loop function is assigned to the integral FPGA for the hybrid DSP-FPGA architecture, and at least the velocity control loop function is assigned to the DSP the hybrid DSP-FPGA architecture;
    or
        wherein at least the current control loop function is assigned the FPGA fabric of the SoC architecture, and at least the velocity control loop function is assigned to the MSS of the SoC architecture.

13. The system for controlling a motor of claim 12, further including motor position sensing as another motor control function of the plurality of motor control functions and allocating the motor position sensing to the FPGA the hybrid DSP-FPGA architecture or the FPGA fabric of the SoC architecture.

14. The system for controlling a motor of claim 12, further including a motor position control loop function as another motor control functions of the plurality of motor control functions and allocating the motor position control loop function to the DSP of the hybrid DSP-FPGA architecture or the MSS of the SoC architecture.

15. The system for controlling a motor of claim 12, further including a Continuous Built in Test (CBIT) function as another motor control functions of the plurality of motor control functions and allocating a at least a portion of the CBIT to the DSP of the hybrid DSP-FPGA architecture or the MSS of the SoC architecture.

16. The system for controlling a motor of claim 15 further including allocating at least portion of the CBIT function to the FPGA of the hybrid DSP-FPGA architecture or the FPGA fabric of the SoC architecture, wherein the portion of the CBIT to the FPGA of the hybrid DSP-FPGA architecture or the FPGA fabric of the SoC architecture is based on a processing rate of the CBIT function.

17. The system for controlling a motor of claim 12, further including a current sensor processing function as another motor control functions of the plurality of motor control functions and allocating the current sensor processing to the FPGA of the hybrid DSP-FPGA architecture or the FPGA fabric of the SoC architecture.

18. The system for controlling a motor of claim 12, further including a PWM processing function as another motor control functions of the plurality of motor control functions and allocating the PWM processing to the DSP of the hybrid DSP-FPGA architecture or the MSS of the SoC architecture.

19. The system for controlling a motor of claim 1, further including a system state machine function as another motor control functions of the plurality of motor control functions and allocating the system state machine function processing to the DSP of the hybrid DSP-FPGA architecture or the MSS of the SoC architecture.

20. A motor drive system, the motor drive system comprising:
   a power source
   a drive operably connected to the power source, the drive including a controller;
   a motor operably connected to the drive, the motor having a plurality of motor control functions including at least a current control loop and a velocity control loop, the system comprising:
      wherein the controller includes one of:
         a hybrid Digital Signal Processor (DSP)-Field Programmable Gate Array (FPGA) architecture having an integral DSP and an integral FPGA
         a System on a Chip (SoC) architecture having a Microcontroller Sub-System (MSS) and an FPGA fabric;
         wherein at least the current control loop function is assigned to the integral FPGA for the hybrid DSP-FPGA architecture, and at least the velocity control loop function is assigned to the DSP the hybrid DSP-FPGA architecture; or
         wherein at least the current control loop function is assigned the FPGA fabric of the SoC architecture, and at least the velocity control loop function is assigned to the MSS fabric of the SoC architecture.

* * * * *